United States Patent
Wu et al.

(10) Patent No.: US 7,400,156 B2
(45) Date of Patent: Jul. 15, 2008

(54) VERTICAL PROBE DEVICE

(75) Inventors: Shih-Chang Wu, Hsinchu Hsiang (TW); Hendra Sudin, Hsinchu Hsiang (TW); Hsin-Hung Lin, Hsinchu Hsiang (TW); Ming-Chi Chen, Hsinchu Hsiang (TW)

(73) Assignee: MJC Probe Incorporation, Chu-Pei, Hsinchu Hsiang (TW)

( * ) Notice: Subject to any disclaimer, the term of this patent is extended or adjusted under 35 U.S.C. 154(b) by 0 days.

(21) Appl. No.: 11/515,731

(22) Filed: Sep. 6, 2006

(65) Prior Publication Data

US 2008/0054919 A1    Mar. 6, 2008

(51) Int. Cl.
*G01R 31/02* (2006.01)
*G01R 31/00* (2006.01)

(52) U.S. Cl. .................. 324/754; 324/758; 324/761

(58) Field of Classification Search .......... 324/754–765
See application file for complete search history.

(56) References Cited

U.S. PATENT DOCUMENTS

| | | | | |
|---|---|---|---|---|
| 4,901,013 | A * | 2/1990 | Benedetto et al. | 324/761 |
| 5,525,911 | A * | 6/1996 | Marumo et al. | 324/754 |
| 6,853,208 | B2 * | 2/2005 | Okubo et al. | 324/758 |
| 2004/0124862 | A1 * | 7/2004 | Sugawara | 324/754 |
| 2006/0066328 | A1 | 3/2006 | Clegg et al. | |
| 2007/0103179 | A1 * | 5/2007 | Tsai et al. | 324/755 |

* cited by examiner

*Primary Examiner*—Ha Nguyen
*Assistant Examiner*—Emily Y Chan
(74) *Attorney, Agent, or Firm*—Bacon & Thomas, PLLC

(57) ABSTRACT

A vertical probe device includes two guide members arranged in a stack manner and defining therebetween an accommodation chamber, a probe holder plate disposed between the guide members, and a plurality of probes inserted through the guide plates and the probe holder plate in such a manner that the probes are flexible within the accommodation chamber. One of the guide plates has at least one through hole. The probe holder plate is slightly moveable in horizontal and vertical directions but fixable to one of the guide plats under a force applied through the at least one through hole to the probe holder plate while the other of the guide plates is removed, thereby preventing damage of the probes or movement of the probes during a maintenance work.

18 Claims, 6 Drawing Sheets

VERTICAL PROBE DEVICE

BACKGROUND OF THE INVENTION

1. Field of the Invention

The present invention relates to a probe device and more particularly, to a vertical probe device, which facilitates the performance of a maintenance work without causing damage to each probe of the probe device.

2. Description of the Related Art

FIG. 1 shows a vertical-type probe card 1 according to the prior art. According to this design, a circuit board 10 of the vertical-type probe card 1 has multiple transmission lines 11 electrically connected to a probe set 12. The probe set 12 comprises an upper guide plate 121, a lower guide plate 122, a probe holder plate 123, and a plurality of probes 120. The upper guide plate 121, the lower guide plate 122 and the probe holder plate 123 each have a plurality of probe holes for receiving the probes 120. During installation, the probe holder plate 123 is held at a predetermined elevation relative to the lower guide plate 122, and then the probes 120 are respectively inserted through the probe holder plate 123 and the lower guide plate 122, and then the upper guide plate 121 is covered on the probe holder plate 123 to keep the probes 120 standing. Each of the probes 120 has an upper end protruding over the top side of the upper guide plate 121 and electrically connected to the transmission line 11 or other signal line on the circuit board 10, and a bottom probe tip protruding over the bottom side of the lower guide plate 122 for probing ICs in a wafer level testing. Because the probe holder plate 123 is provided for holding the probes 120 to be inserted through and aligned with the respective probe holes of the guide plate 121 and 122, it is designed to have a certain looseness relative to each of the probes 120. In addition, by means of the structure of a free space defined between the upper guide plate 121 and the lower guide plate 122 for allowing displacement of the body portion of each of the probes 120, the bottom probe tip of each of the probes 120 can flexibly be adjusted to the same probing plane when all of the probes 120 press on the testing ICs at the same time. As a result, the probe set 12 effectively eliminates the anti-force against from the stressed ICs and prevents damage to any of the probes 120, and therefore ensures an optimal contact of the vertical probe device 1 with all ICs at the test wafer.

In actual application, replacement or repair of a maintenance work is necessary for probes of a probe device after a long term test engineering. During a maintenance work of the probe set 12, the upper guide plate 12 must be taken away and then the damaged or worn probes 120 must be pulled out from the probe holder plate 123 and the lower guide plate 122 for replacement or repair. However, because the probe holder plate 123 is covered by the upper guide plate 121 without fixing to any structures of the probe set 12, it may be lifted with the upper guide plate 121 by the adhesion force induced by taking away the upper guide plate 12 in the maintenance work. As a result, the relative probes 120 standing on the lifted portion of the probe holder plate 123 are forced to be pulled out from the lower guide plate 122, thus a rework of inserting those still good probes 120 into the probe holder plate 123 and the lower guide plate 122 will be necessary. Therefore, this design requires much labor and time in maintenance. Further, once the probe holder plate 123 is lifted, the correspondingly lifted probes 120 may somewhat be distorted and/or even damaged, thus the extra cost must be paid.

FIG. 2 shows a Hybrid-buckling beam probe device 20 constructed according to US patent publication No. 2006/0066328. According to this design, a template 32 provided as the probe holder plate 123 of the aforesaid prior art is adhered to the top side of a raised boss formed above a lower die 28. Therefore, the template 32 is kept in place during the maintenance engineering to open an upper die to repair or replace the damaged or worn probes 36. However, because the template 32 is affixed to the lower die 28, it cannot provide the certain looseness and flexibility to the relative probes 36 as the aforementioned probe holder plate 123 of the vertical probe device 1. At the moment the probes 36 touch the test devices on a semiconductor wafer, the probes 36 receive a forward stress of the anti-force against from the probing devices with limitation to release out, thereby resulting in high possibility of being damaged and shortening the lifetime of the probes 36. Therefore, this design of Hybrid-buckling beam probe device is still not satisfactory in function.

SUMMARY OF THE INVENTION

The present invention has been accomplished under the circumstances in view. It is therefore the primary objective of the present invention to provide a vertical probe device, which extends the lifetime of probes in a wafer level test and facilitates the performance of a maintenance work for the probe device.

To achieve this objective of the present invention, the vertical probe device comprises two guide plates arranged in a stack manner, a probe holder plate and a plurality of probes. The probes are made of an electrically conducting material and are used for probing the electronic devices of circuits of the wafer under test. The guide plates and the probe holder plate have respectively probe holes through which the probes are respectively inserted. One of the guide plates has at least one through hole and the two guide plates define therebetween an accommodation chamber. The probe holder plate is disposed between the two guide plates. The probes are flexible within the accommodation chamber. The probe holder plate is slightly moveable in horizontal and vertical directions but fixable to one of the guide plats under a force applied through the at least one through hole to the probe holder plate while the other of the guide plates is removed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
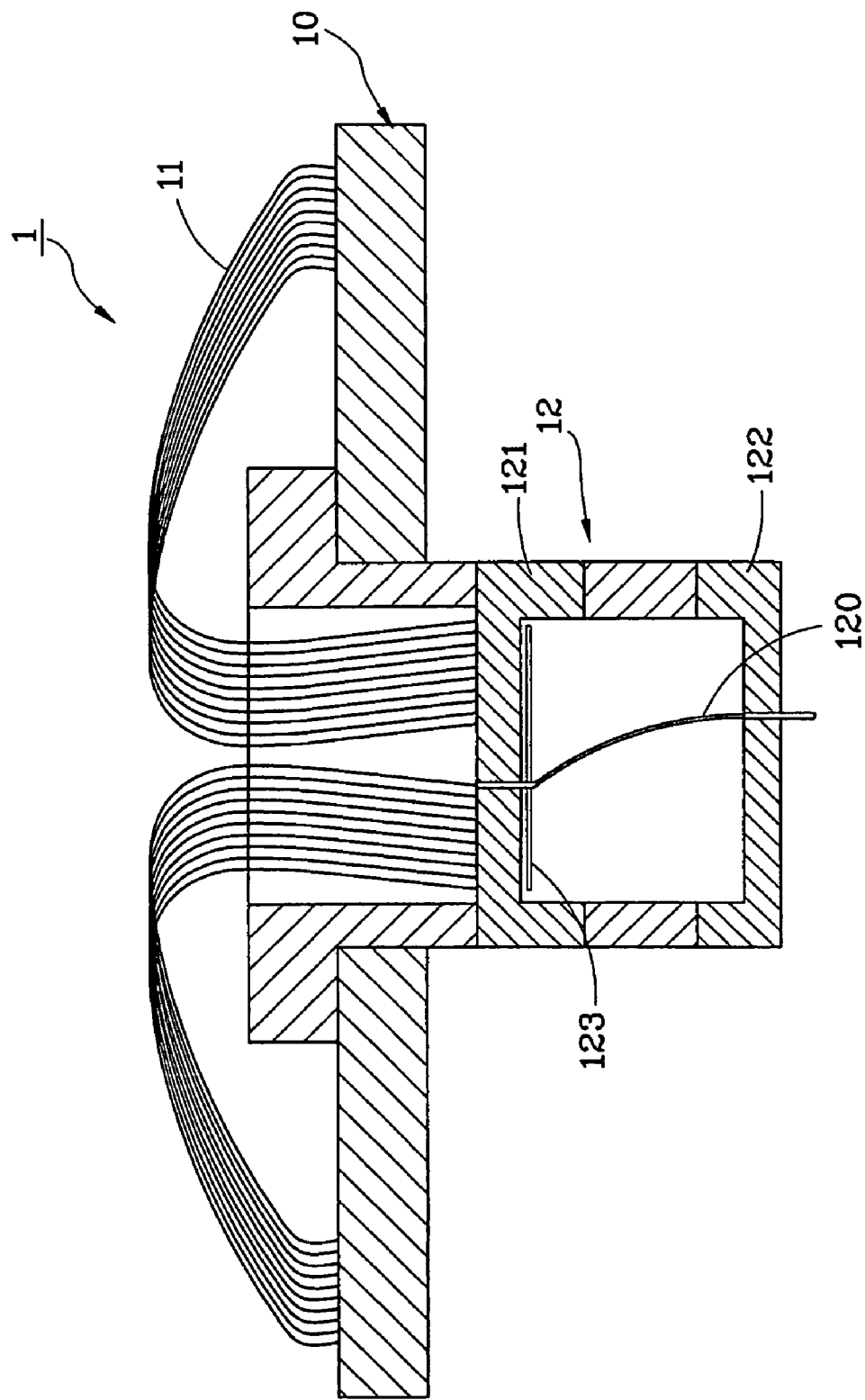
FIG. 1 is a schematic sectional view of a vertical probe card according to the prior art.
Figure 2:
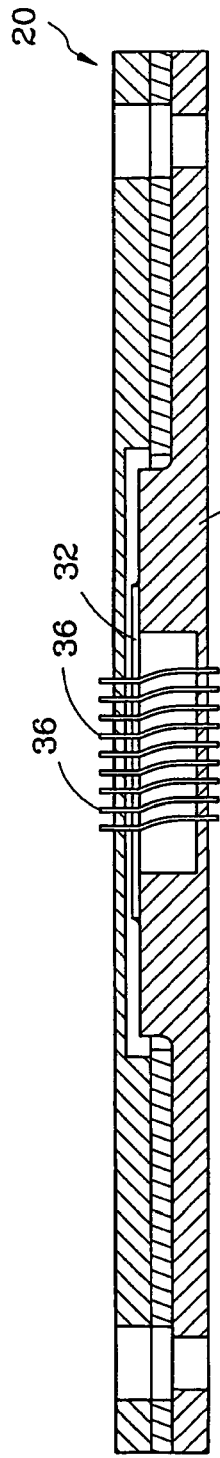
FIG. 2 is a sectional view of a vertical probe device according to US patent publication No. 2006/0066328.
Figure 4:
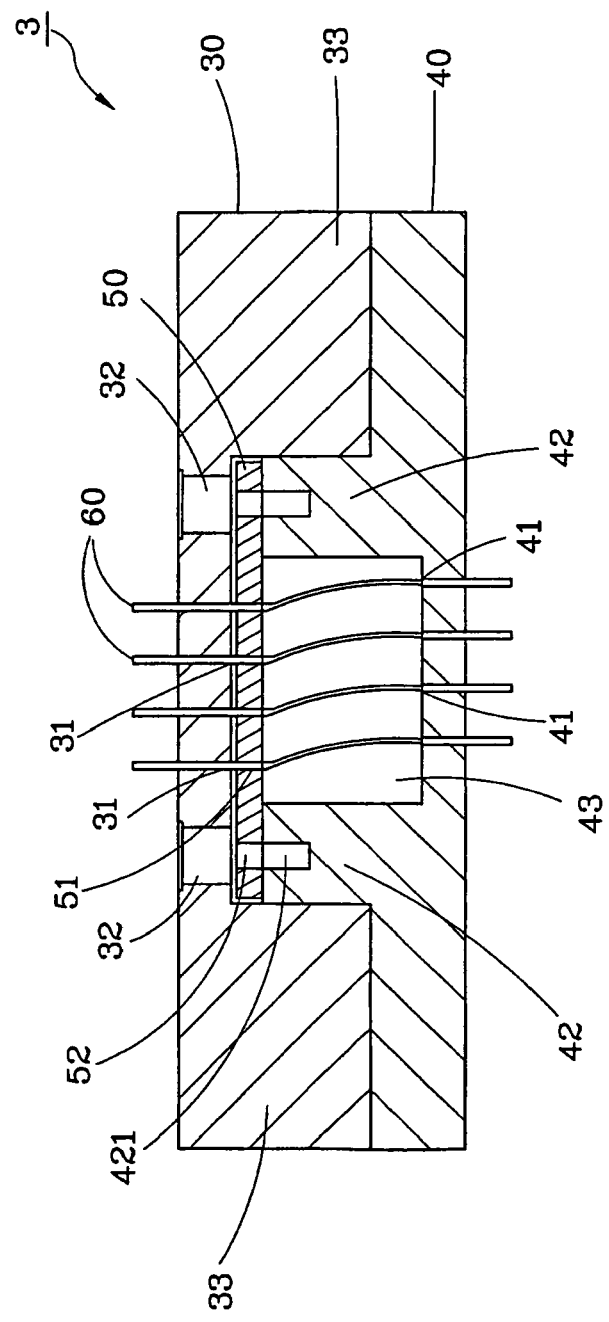
FIG. 4 is a sectional view of the vertical probe device in accordance with the first preferred embodiment of the present invention.
Figure 3:
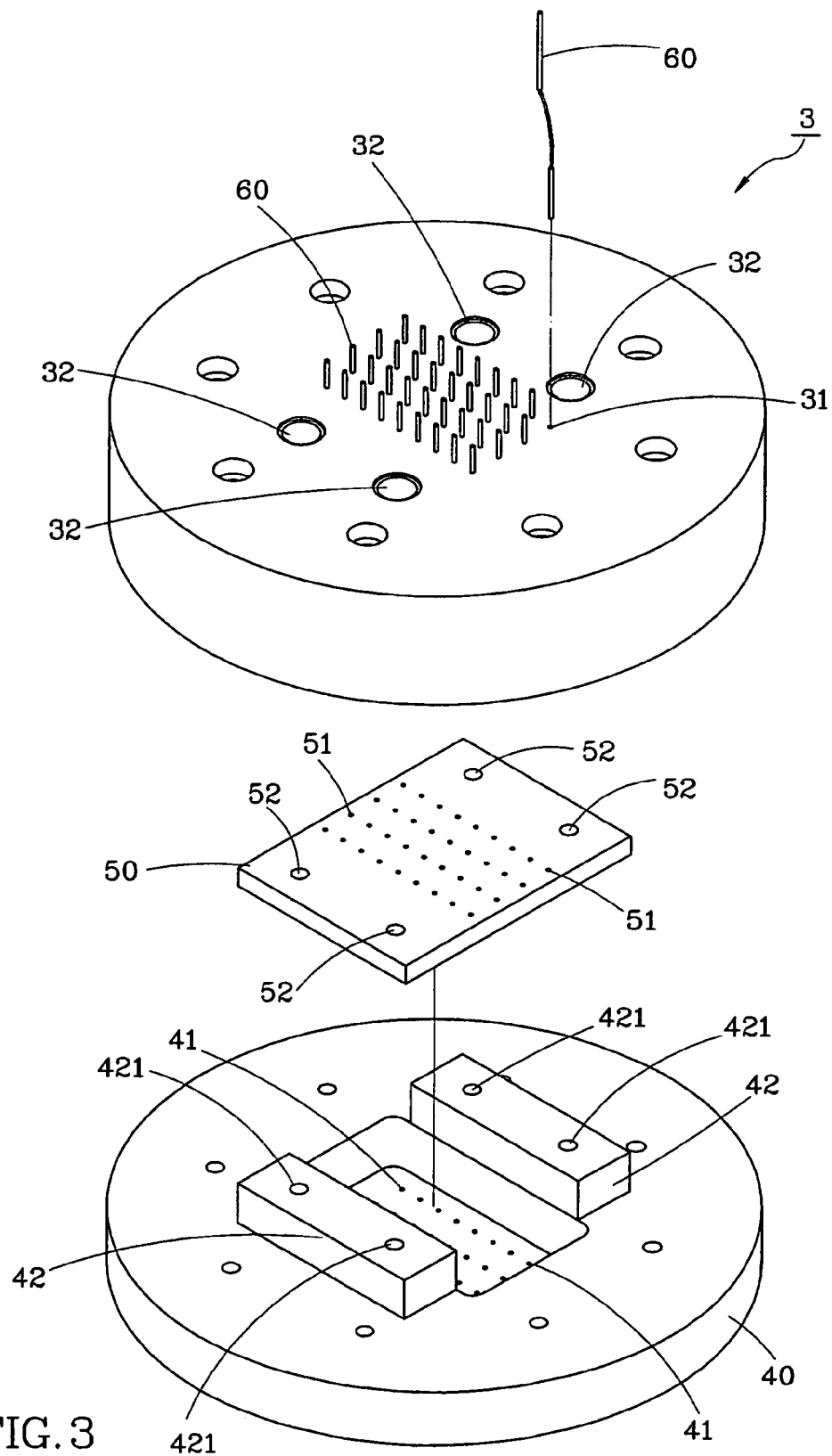
FIG. 3 is an exploded view of a vertical probe device constructed in accordance with a first preferred embodiment of the present invention.

As shown in FIGS. 3 and 4, a vertical probe device 3 for testing semiconductor wafers or the like in accordance with a first preferred embodiment of the present invention comprises a first guide plate 30, a second guide plate 40, a probe holder plate 50, and multiple conductive probes 60 for probing contact pads of ICs on a semiconductor wafer.

The first guide plate 30 and the second guide plate 40 are connected with each other in a stack, each having a plurality of probe holes 31 or 41 for the insertion of the probes 60. The diameter of the probe holes 31 and 41 is approximately equal to the diameter at each of the two distal ends of each probe 60. The first guide plate 30 has four through holes 32 and a support 33 downwardly protruding from the bottom of the first guide plate 30 and surrounding the through holes 32. The second guide plate 40 has two supports 42 and an accommodation open chamber 43. The two supports 42 protrude over the top surface of the second guide plate 40 at a height smaller than that of the support 33 of the first guide plate 30 and a height difference between the supports 42 and the support 33 is greater than the thickness of the probe holder plate 50. The supports 42 each have two screw holes 421 corresponding to the through holes 32. The accommodation open chamber 43 is a recessed space defined between the supports 42.

The probe holder plate 50 is made of an insulating material and supported by the supports 42 such that the probe holder plate 50 covers the accommodation open chamber 43. The probe holder plate 50 has a plurality of probe holes 51 and four screw holes 52. The probe holes 51 of the probe holder plate 50 respectively correspond to the probe holes 31 and 41 of the first guide plate 30 and the second guide plate 40 for the insertion of the probes 60. The diameter of the probe holes 51 is approximately equal to the cross section of the body of each probe 60. The screw holes 52 of the probe holder plate 50 are respectively aligned with the screw holes 421 of the supports 42 of the second guide plate 40 for the insertion of respective fasteners, for example, screws 53 (see FIG. 5). The maximum outer diameter of the screws 53 is smaller than the through holes 32 of the first guide plate 30 so that the screws 53 are passable through the through holes 32 of the first guide plate 30.

Figure 5:
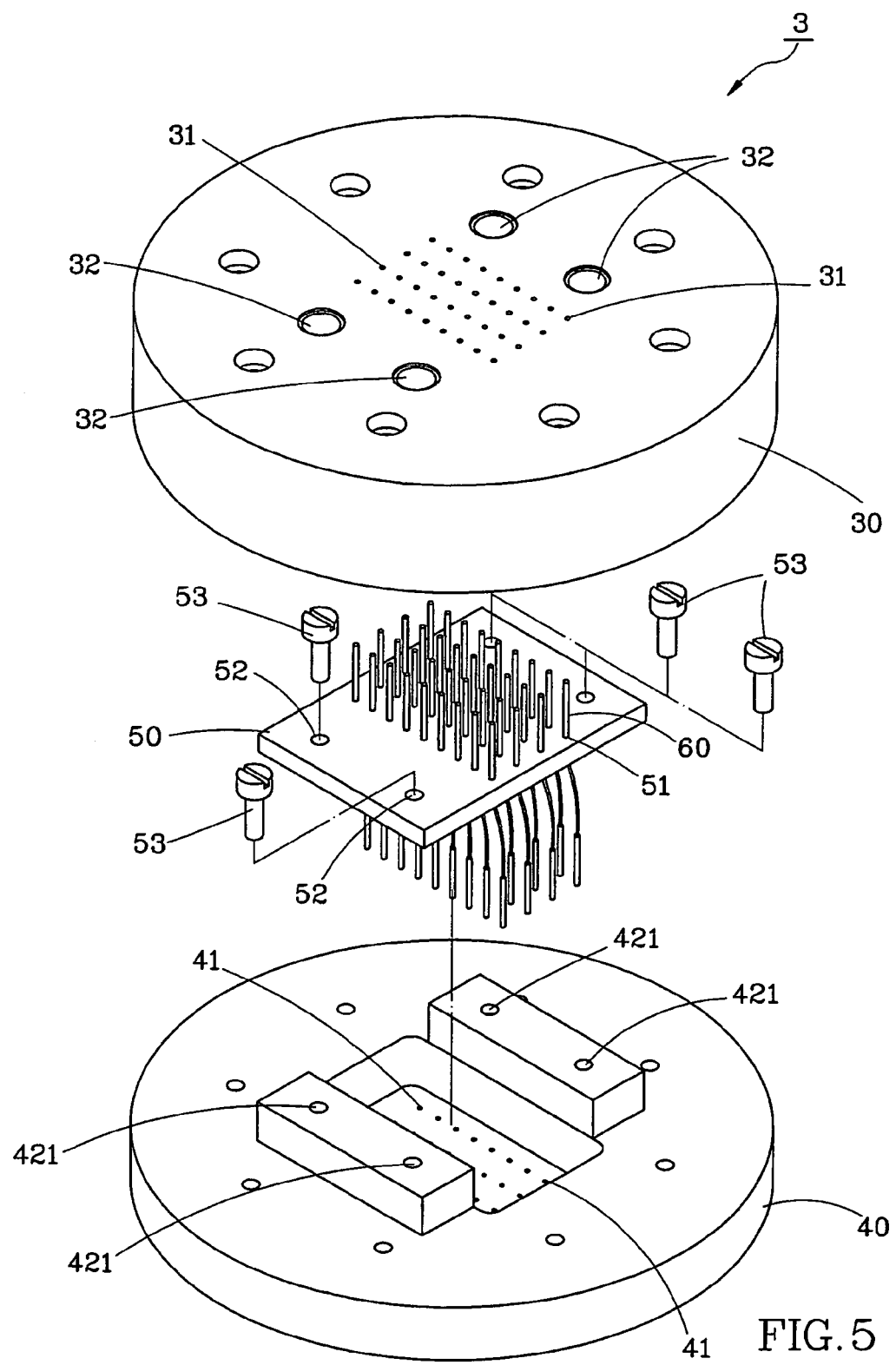
FIG. 5 is an exploded view of the first preferred embodiment of the present invention during the assembly process of the vertical probe device.

Referring to FIG. 5, in the assembly process of the probe device 3, four screws 53 are respectively fastened to the screw holes 52 of the probe holder plate 50 and the screw holes 421 of the supports 42 of the second guide plate 40 to affix the probe holder plate 50 to the second guide plate 40, and then the probes 60 are respectively inserted through the probe holes 51 of the probe holder plate 50 and the probe holes 41 of the second guide plate 40 and kept in vertical. And then, align the probe holes 31 of the first guide plate 30 with the probes 60 respectively such that the probes 60 can be respectively inserted through the probe holes 31 of the first guiding plate 30 and the first guide plate 30 can cover over the probe holder plate 50. And then, remove the four screws 53 from the probe holder plate 50 and the second guide plate 40 through the through holes 32 of the first guide plate 30. After the assembly is completed, the probe holder plate 50 is slightly movable horizontally as well as vertically in between the first guide plate 30 and the second guide plate 40. As shown in FIG. 4, the probes 60 are respectively inserted through the three-layer structure of the first guide plate 30, probe holder plate 50 and second guide plate 40, and kept in vertical. Further, the height difference between the support 33 of the first guide plate 30 and the supports 42 of the second guide plate 40 provides a space for allowing slight displacement of the probe holder plate 50 horizontally as well as vertically so that the probes 60 are slightly deformable to prevent friction between the probes 60 and the probe holder plate 50 when the probes 60 touch the test devices.

Figure 6:
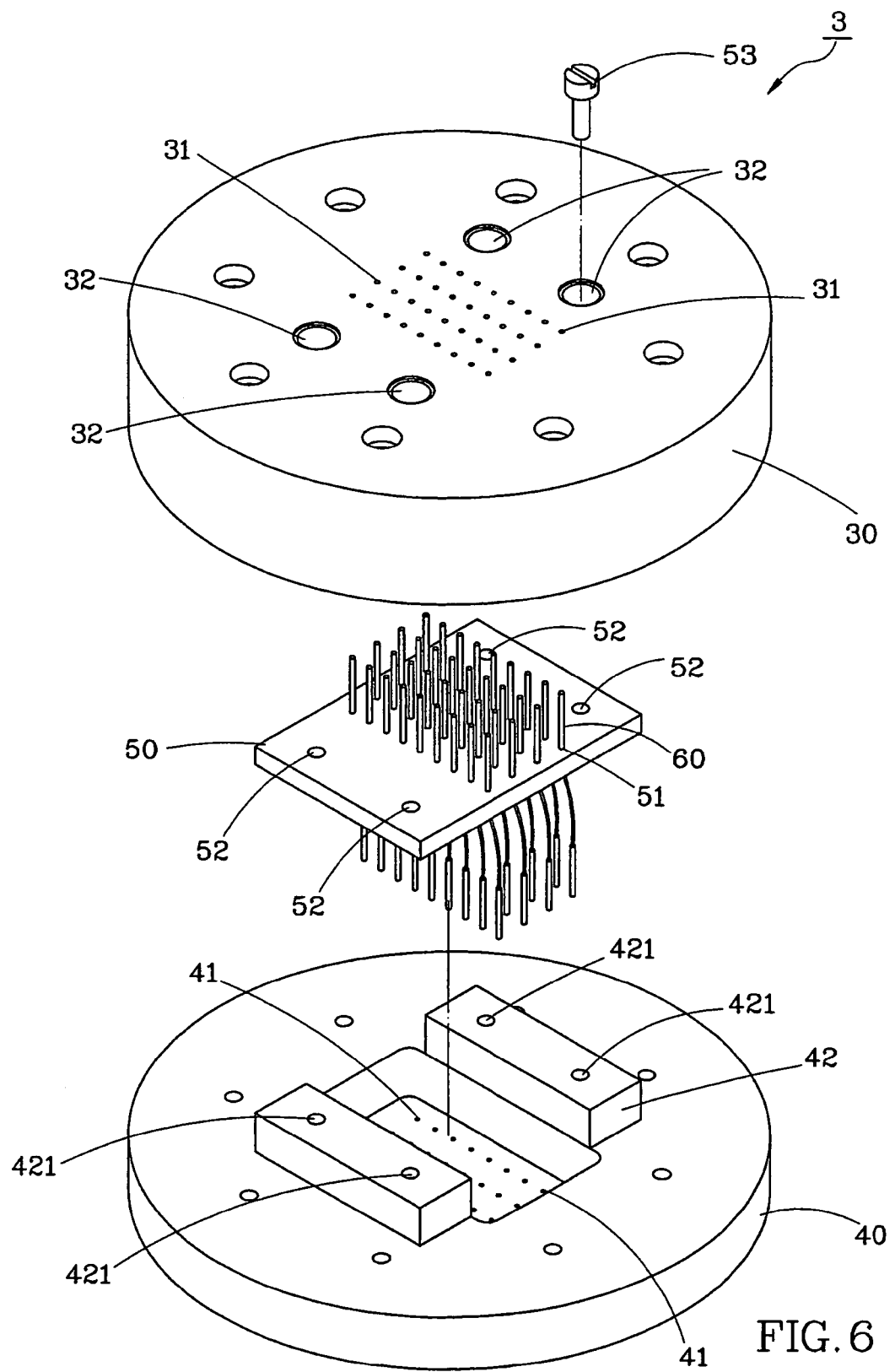
FIG. 6 is an exploded view of the first preferred embodiment of the present invention during a maintenance work of the vertical probe device.

Referring to FIG. 6, when replacing or repairing the probes 60 during a maintenance work, four screws are respectively fastened to the screw holes 52 of the probe holder plate 50 and the screw holes 421 of the supports 42 of the second guide plate 40 through the through holes 32 of the first guide plate 30 to affix the probe holder plate 50 to the second guide plate 40 in advance, and then the first guide plate 30 is removed away without displacement or lift of the probe holder plate 50 and the probes 60, and then the damaged or worn probes 60 can be replaced or repaired. Therefore, the maintenance work of the probe device 3 is easy and will not cause damage to the probes 60.

Figure 7:
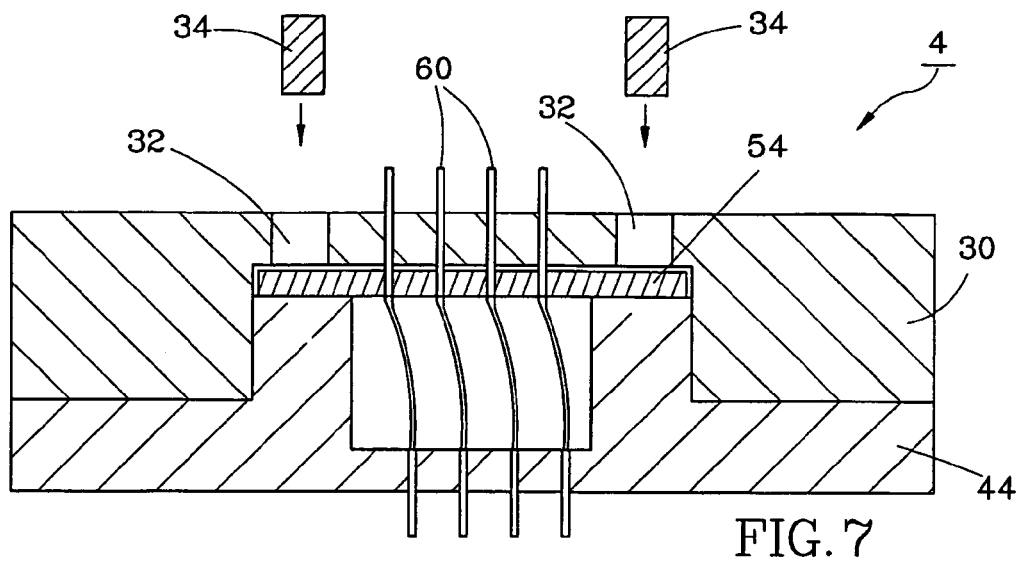
FIG. 7 is a schematic sectional view of a vertical probe device in accordance with a second preferred embodiment of the present invention.

The measure to affix the probe holder plate 50 to the second guide plate 40 is not limited to the arrangement of the screws 53 and the screw holes 52 and 421. FIG. 7 shows a vertical probe device 4 in accordance with a second preferred embodiment of the present invention. According to this embodiment, magnetic members 34 are used to fasten the probe holder plate, referenced by 54, to the second guide plate, referenced by 44 by means of magnetism. For example, a magnetically inductive device is provided at the bottom side of the probe device 4 to attract the magnetic members 34, thereby holding down the probe holder plate 54 firmly on the second guide plate 44. The means of magnetism for fixing the probe holder plate with respect to the second guide plate is not limited to the arrangement of the magnetically inductive device at the bottom side of the vertical probe device, that is, not limited to the direction of induced magnetic-field of the magnetic members. Any of a variety of other measures that cause a magnetic force acting in direction from the probe holder plate 54 toward the second guide plate 44 may be employed to achieve the same effect. During a maintenance work, the magnetic members 34 are respectively inserted into the through holes 32 of the first guide plate 30 and closely attached to the probe holder plate 54 to secure the probe holder plate 54 to the second guide plate 44 firmly in place for allowing removal of the first guide plate 30 without displacing or lifting the probe holder plate 54 and the probes 60.

Figure 8:
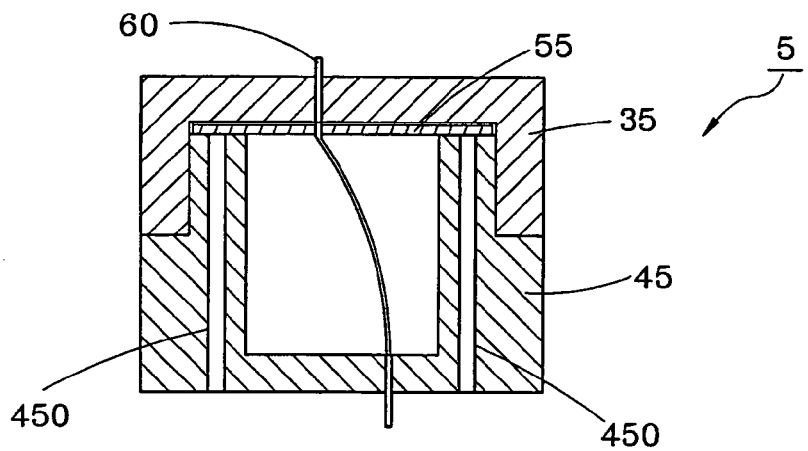
FIG. 8 is a schematic sectional view of a vertical probe device in accordance with a third preferred embodiment of the present invention.

FIG. 8 illustrates a vertical probe device 5 in accordance with a third preferred embodiment of the present invention. According to this embodiment, the probe device 5 comprises a first guide plate 35, a second guide plate 45, a probe holder plate 55, and probes 60. This third embodiment is substantially similar to the aforesaid first and second embodiments with the exception that the first guide plate 35 eliminates the aforesaid through holes; the second guide plate 45 has through holes 450 cut through the supports thereof. When the probe holder plate 55 is covered on the second guide plate 45, it blocks the through holes 450. A vacuum pump or like means may be used to draw air out of the through holes 450, keeping the through holes 450 in a lower air pressure with respect to the ambient air or even in a vacuum state so that the probe holder plate 55 is firmly secured to the second guide plate 45 for allowing removal of the first guide plate 35 during a maintenance work without displacing or lifting the probe holder plate 55 and the probes 60.

Figure 9:
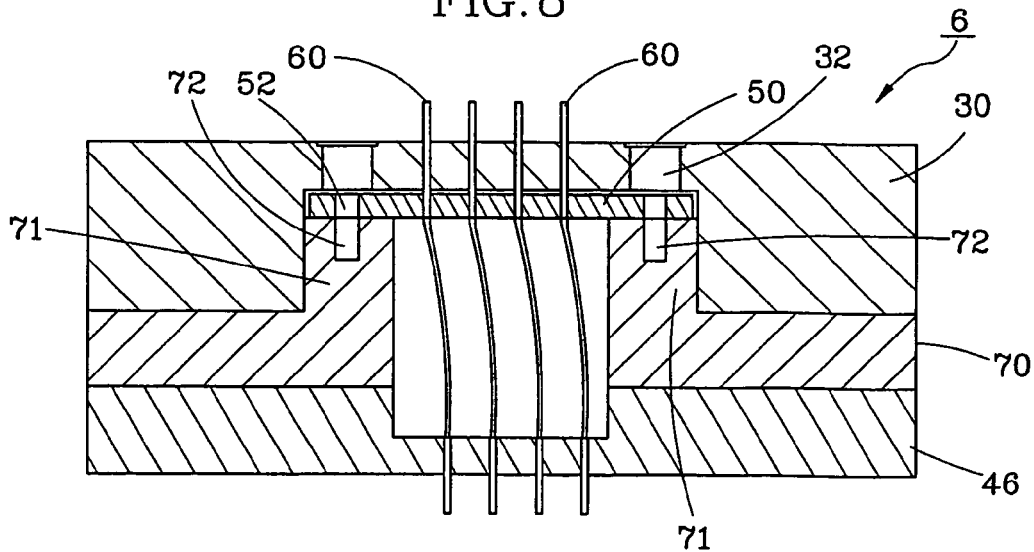
FIG. 9 is a schematic sectional view of a vertical probe device in accordance with a fourth preferred embodiment of the present invention.

Further, the vertical probe device of the present invention is not limited to the structure with the respective supports of the first and second guide plate of the aforesaid embodiments. FIG. 9 shows a vertical probe device 6 in accordance with a fourth preferred embodiment of the present invention. According to this embodiment, the second guide plate comprises a spacer 70 located below the first guide plate 30, and a base plate 46 attached to a bottom side of the spacer 70. The spacer 70 has two supports 71 protruded from the top wall thereof. The supports 71 each have a plurality of screw holes 72 corresponding to the through holes 32 on the first guide plate 30 and the screw holes 52 on the probe holder plate 50. Thus, the probe holder plate 50 can be affixed to the spacer 70 with screws during a maintenance work. When a different set of probes 60 of a different length is used to fit a different probing application, a different height of spacer 70 may be provided to support the probe holder plate 50 above the base plate 46 at a desired elevation so that the installed probes 60 are kept at the optimal elevation for proving test devices accurately.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vertical probe device comprising:
   a first guide plate and a second guide plate arranged in a stack manner and defining therebetween an accommodation chamber, one of the first guide plate and the second guide plate having at least one through hole;
   a probe holder plate made of an electrically insulating material and movable horizontally as well as vertically between the first guide plate and the second guide plate, said probe holder plate being fixable to one of the first guide plate and the second guide plate while the other guide plate is removed and a force is applied through said at least one through hole to the probe holder; and
   a plurality of probes made of an electrically conducting material and respectively inserted through the first guide plate, the probe holder plate and the second guide plate in such a manner that the probes are flexible within the accommodation chamber.

2. The vertical probe device as claimed in claim 1, wherein the first guide plate has at least one support facing the second guide plate and the second guide plate has at least one support facing the first guide plate and having a height smaller than a height of the at least one support of the first guide plate; wherein the probe holder plate is supported on the at least one support of the second guide plate and surrounded by the at least one support of the first guide plate.

3. The vertical probe device as claimed in claim 2, wherein the accommodation chamber is located between the probe holder plate and the second guide plate.

4. The vertical probe device as claimed in claim 2, wherein said at least one through hole is formed on said first guide plate corresponding in location to the at least one support of the second guide plate and surrounded by the at least one support of the first guide plate.

5. The vertical probe device as claimed in claim 4, further comprising at least one fastener passable through the at least one through hole for fastening the probe holder plate to the second guide plate.

6. The vertical probe device as claimed in claim 5, wherein the at least one support of the second guide plate and the probe holder plate each have at least one screw hole corresponding to the at least one through hole, and the at least one fastener, which is a screw, is engaged in the screw holes.

7. The vertical probe device as claimed in claim 4, further comprising at least one magnetic member insertable through the at least one through hole for applying a magnetic force to the probe holder plate so as to fix the probe holder plate to the second guide plate upon receiving a magnetic induction.

8. The vertical probe device as claimed in claim 2, wherein the at least one through hole is formed on the at least one support of the second guide plate, and the probe holder plate is supported on the at least one support of the second guide plate and covered on the at least one through hole.

9. The vertical probe device as claimed in claim 8, wherein the probe holder plate is fixed to the second guide plate by adsorption by lowering the air pressure in the at least one through hole to a value smaller than the air pressure of the ambient air.

10. A vertical probe device comprising:
    a first guide plate and a second guide plate arranged in a stack manner and defining therebetween an accommodation chamber, one of the first guide plate and the second guide plate having at least one through hole;
    a probe holder plate made of an electrically insulating material and movably disposed between the first guide plate and the second guide plate but fixable to one of the first guide plate and the second guide plate under a force applied through said at least one through hole to the probe holder plate while the other of the first guide plate and the second guide plate is removed; and
    a plurality of probes made of an electrically conducting material and respectively inserted through the first guide plate, the probe holder plate and the second guide plate in such a manner that the probes are flexible within the accommodation chamber,
    wherein the second guide plate comprises a spacer located below said first guide plate, and a base plate attached to a bottom side of the spacer; wherein the probe holder plate is supported on the spacer.

11. The vertical probe device as claimed in claim 10, wherein the first guide plate has at least one support facing the spacer and the spacer has at least one support facing the first guide plate; wherein the probe holder plate is supported on the at least one support of the spacer, surrounded by the at least one support of the first guide plate and movable horizontally and vertically.

12. The vertical probe device as claimed in claim 11, wherein the accommodation chamber is defined between the probe holder plate and the base plate.

13. The vertical probe device as claimed in claim 11, wherein said at least one through hole is formed on said first guide plate corresponding in location to the at least one support of the spacer and surrounded by the at least one support of the first guide plate.

14. The vertical probe device as claimed in claim 13, further comprising at least one fastener passable through the at least one through hole for fastening the probe holder plate to the spacer.

15. The vertical probe device as claimed in claim 14, wherein the at least one support of the spacer and the probe holder plate each have at least one screw hole corresponding to the at least one through hole, and the at least one fastener, which is a screw, is engaged in the screw holes.

16. The vertical probe device as claimed in claim 13, further comprising at least one magnetic member insertable through the at least one through hole for applying a magnetic force to the probe holder plate so as to fix the probe holder plate to the spacer upon receiving a magnetic induction.

17. The vertical probe device as claimed in claim 11, wherein the at least one through hole is formed through the spacer and the base plate, and the probe holder plate is supported on the spacer of the second guide plate and covered on the at least one through hole.

18. The vertical probe device as claimed in claim 17, wherein the probe holder plate is fixed to the spacer by adsorption by lowering the air pressure in the at least one through hole to a value smaller than the air pressure of the ambient air.

* * * * *